United States Patent
Tsorng et al.

(10) Patent No.: US 10,869,403 B2
(45) Date of Patent: Dec. 15, 2020

(54) ELASTOMER DESIGN FOR COMPUTING DEVICE CHASSIS

(71) Applicant: QUANTA COMPUTER INC., Taoyuan (TW)

(72) Inventors: Yaw-Tzorng Tsorng, Taoyuan (TW); Chun Chang, Taoyuan (TW); Hsin-Chieh Lin, Taoyuan (TW); Guan-Ming Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/133,264

(22) Filed: Sep. 17, 2018

(65) Prior Publication Data

US 2020/0093020 A1    Mar. 19, 2020

(51) Int. Cl.
| H05K 7/14 | (2006.01) |
| H05K 5/02 | (2006.01) |
| H05K 5/03 | (2006.01) |

(52) U.S. Cl.
CPC ......... *H05K 7/1401* (2013.01); *H05K 5/0221* (2013.01); *H05K 5/03* (2013.01); *H05K 7/1487* (2013.01); *H05K 7/1489* (2013.01)

(58) Field of Classification Search
CPC .. H05K 7/1401; H05K 7/1487; H05K 7/1489; H05K 5/0221; H05K 5/03; H05K 5/0239; G06F 1/181; G06F 1/184
See application file for complete search history.

(56) References Cited

U.S. PATENT DOCUMENTS

| 6,711,009 B2* | 3/2004 | Lee ........................ G06F 1/181 248/551 |
| 6,711,859 B2* | 3/2004 | Bell ....................... B65D 11/00 220/4.02 |
| 6,929,338 B2* | 8/2005 | Chang ..................... G06F 1/181 312/223.2 |
| 7,967,399 B1* | 6/2011 | Baiza .................... A47B 88/427 312/223.1 |

(Continued)

FOREIGN PATENT DOCUMENTS

| CN | 201174836 Y | 12/2008 |
| EP | 939937 B1 | 4/2007 |

(Continued)

OTHER PUBLICATIONS

TW Office Action for Application No. 107143130, dated Aug. 14, 2019, w/ First Office Action Summary.

(Continued)

*Primary Examiner* — James Wu
*Assistant Examiner* — Christopher L Augustin
(74) *Attorney, Agent, or Firm* — Nixon Peabody LLP (57) ABSTRACT

The present disclosure provides for a computer chassis in which a base component can have a plurality of guide slots. A top cover of the chassis can have a plurality of guide pins where each guide pin is configured to fit into a guide slot. The base component and top cover also comprise an elastomer positioned adjacent to at least some of the guide slots. The elastomer pushes against a guide pin to force the guide pin into the guide slot. The elastomer therefore reduces or eliminates a gap between the base component and the top cover.

14 Claims, 8 Drawing Sheets

(56) References Cited

U.S. PATENT DOCUMENTS

| | | | | |
|---|---|---|---|---|
| 8,118,267 | B2* | 2/2012 | Yu | H05K 7/1489 |
| | | | | 248/222.11 |
| 8,837,129 | B2* | 9/2014 | Fu | H05K 7/1487 |
| | | | | 361/679.02 |
| 8,864,183 | B1* | 10/2014 | Mason | H05K 5/03 |
| | | | | 292/1 |
| 9,055,689 | B2* | 6/2015 | Yu | H05K 5/0226 |
| 9,215,817 | B1* | 12/2015 | Cohen | H05K 5/0221 |
| 9,478,919 | B1* | 10/2016 | Huang | H01R 13/6691 |
| 9,696,769 | B1* | 7/2017 | Hamilton | G06F 1/181 |
| 2003/0227740 | A1 | 12/2003 | Lee et al. | |
| 2005/0068745 | A1* | 3/2005 | Hartman | H05K 7/1421 |
| | | | | 361/726 |
| 2007/0114895 | A1* | 5/2007 | Chen | H05K 7/1489 |
| | | | | 312/333 |
| 2014/0001942 | A1* | 1/2014 | Mao | H05K 5/0239 |
| | | | | 312/333 |
| 2014/0062273 | A1* | 3/2014 | Lee | H05K 5/0221 |
| | | | | 312/223.1 |
| 2016/0313703 | A1 | 10/2016 | Ely et al. | |
| 2019/0363483 | A1* | 11/2019 | Gomez | H01R 13/5213 |

FOREIGN PATENT DOCUMENTS

| | | |
|---|---|---|
| EP | 2599371 B1 | 9/2017 |
| TW | 201410124 A | 3/2014 |
| TW | 201742528 A | 12/2017 |
| WO | 03014893 A2 | 2/2003 |
| WO | 2006076258 A2 | 7/2006 |
| WO | 2017058916 A1 | 4/2017 |

OTHER PUBLICATIONS

TW Search Report for Application No. 107143130, dated Aug. 14, 2019, w/ First Office Action.
Extended European Search Report for EP Application No. 19153783.6, dated Jul. 8, 2019.

* cited by examiner

ELASTOMER DESIGN FOR COMPUTING DEVICE CHASSIS

FIELD

The present invention relates to elastomer placement in a computing device chassis.

BACKGROUND

Computing devices, such as servers, can be contained in a chassis that enclose components of the computing device. These chassis can be constructed in an automated assembly fashion, which provides a cheap and efficient method of manufacturing computing devices. However, automated assembly methods typically result in gaps between the components of the chassis, such as between a base component and a top cover when combined. These gaps can affect the appearance of the computing device; can cause thermal cooling or heating issues within the computing device; and can also contribute to electromagnetic interference (EMI) within the computing device. These gaps cannot be made any smaller by increasing either the size of the top cover or the size of the base component due to structural concerns. If the two base component and the top cover are designed such that they physically interfere, or overlap, with each other, there can be internal stress and friction between the two components. This stress and friction can cause physical damage to either the base component or the top cover.

Conventional methods attempt to address the gaps between the chassis components by including a latch component that can lock the top cover into the base component. However, even when the latch component is locked, a gap still exists between the top cover and the base component. Therefore, what is needed is a way to can seal the gap between top covers and base components of chassis without causing structural damage to the chassis.

SUMMARY

The various examples of the present disclosure are directed towards a chassis for a computing device that comprises a base component, a top cover, and a biasing element. The base component can include a plurality of guide slots. The top cover can comprise a plurality of guide pins that correspond to the plurality of guide slots. The guide pins can be positioned in the guide slots when the base component is in a mating position with the top cover. The biasing element can be positioned adjacent to at least one of the guide slots. The biasing element can push against at least one of the guide pins that correspond to at least one of the guide slots in the mating position.

In some examples, the biasing element can comprise an elastomer.

In some examples, at least one of the plurality of guide slots can be tapered between an opening portion and an end portion. The guide slot can thus reach a smaller diameter than a diameter of a guide pin in order to yield a hard stop. This hard stop can position the top cover so as to define a gap between the base component and the top cover.

In some examples, the elastomer positions the top cover to define an interference fit with the base component.

In some examples, the chassis and top cover can further comprise a spring to assist the biasing element to push against at least some of the guide pins. The spring can be incorporated into the biasing element.

In some examples, the biasing element can possess an elastic force greater than the frictional force of the top cover with the base component.

In some examples, an upper and a lower wall of the guide slot can define a functional area in which the guide pin is positioned. This positioning can assure a gap of a target size between the top cover and the base component. For example, the target size can have a largest acceptable size in order to yield a target largest gap and a smallest acceptable size to yield a target smallest gap. The biasing element can be positioned to maintain the guide pin in the functional area. The functional area can be larger than a distance of the target gap such that a placement of the biasing element always provides an elastic force on the guide pin.

In some examples, the target gap can comprise a nominal distance plus or minus a predetermined deviation.

In some examples, guide slots can be provided on opposing sides of the chassis. A plurality of elastomers can be adjacent to each of the plurality of guide slots.

BRIEF DESCRIPTION OF THE DRAWINGS

The accompanying drawings exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

The present invention is described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present disclosure is directed to computing device chassis design that includes an elastomer designed to reduce a gap between a chassis base component and a top cover. The elastomer can be positioned adjacent to guide slots of the chassis base component. When the guide slots receive guide pins from the top cover, the elastomer can push against the guide pins to force a close fit of the top cover against the chassis base component. Therefore, the present disclosure provides a mechanical solution to eliminate the gap between a chassis base component and a top cover. Elimination of this gap helps to standardize airflow through the computer chassis; creates a better visual appearance; and reduces the entry points of dust and debris into the computer chassis.

Figure 1A:
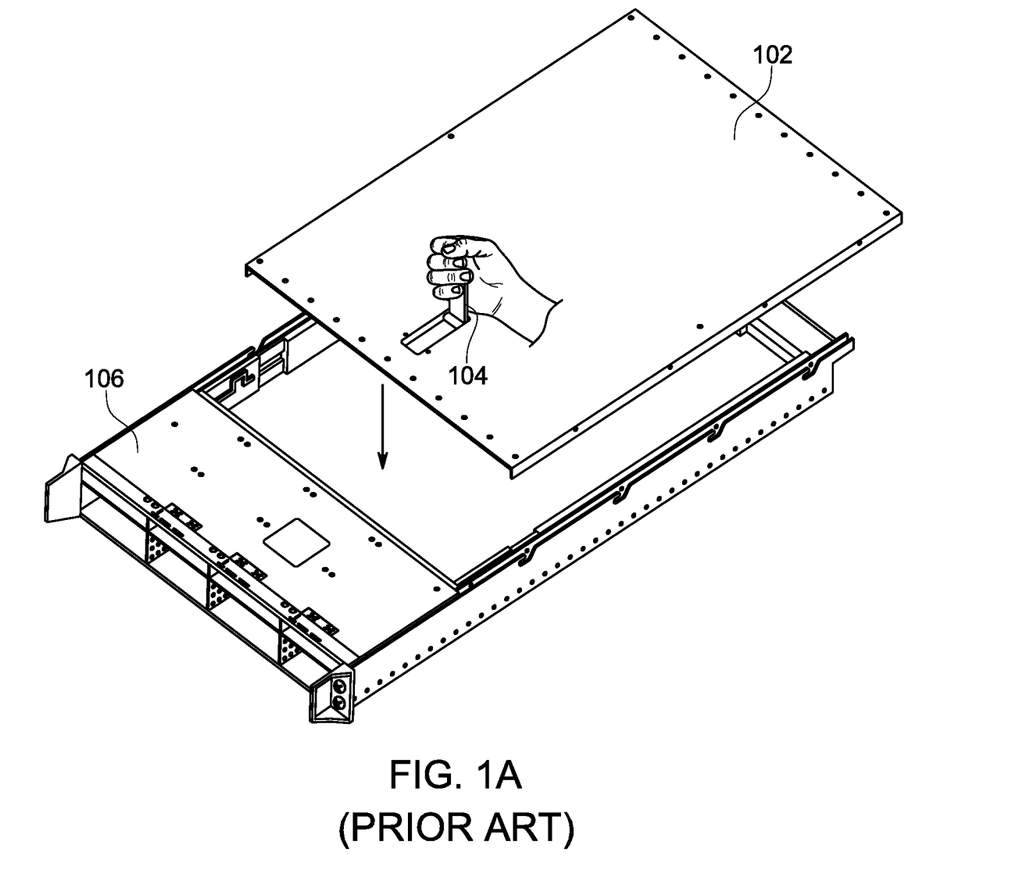
FIGS. 1A-1D show an exemplary computer chassis and top cover, as known in the prior art.
Figure 1B:
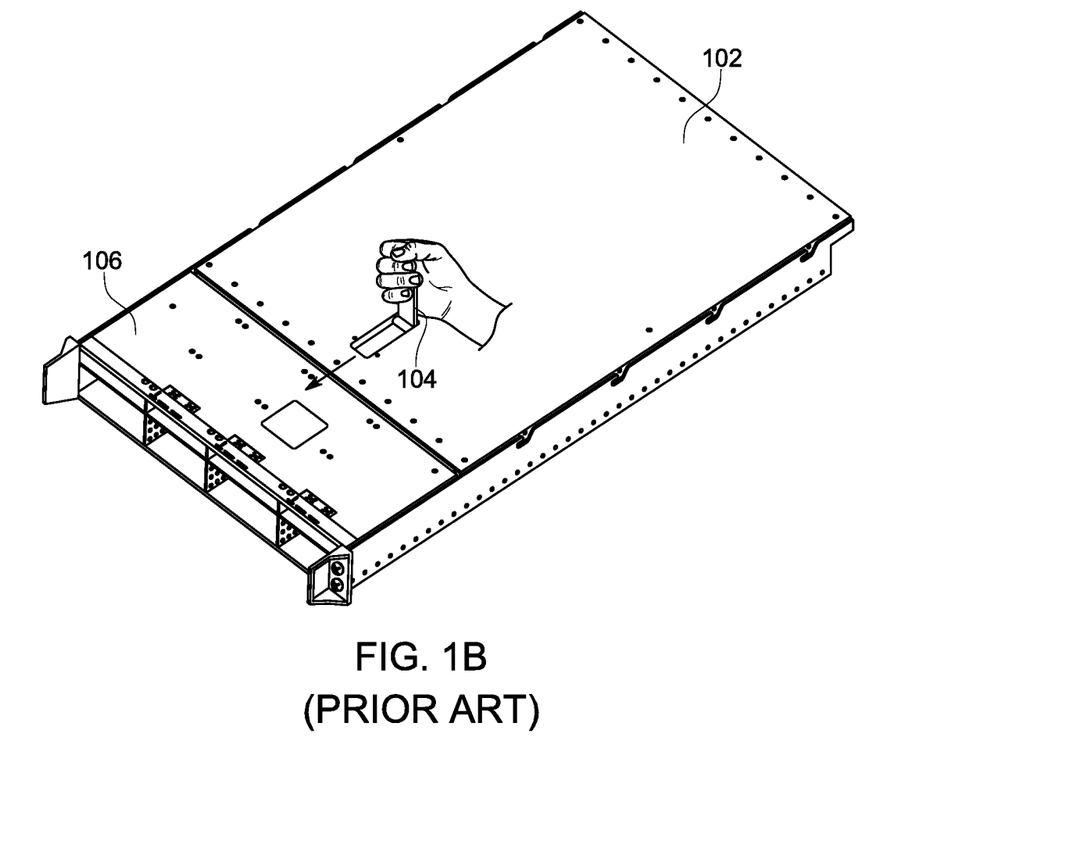
Figure 1C:
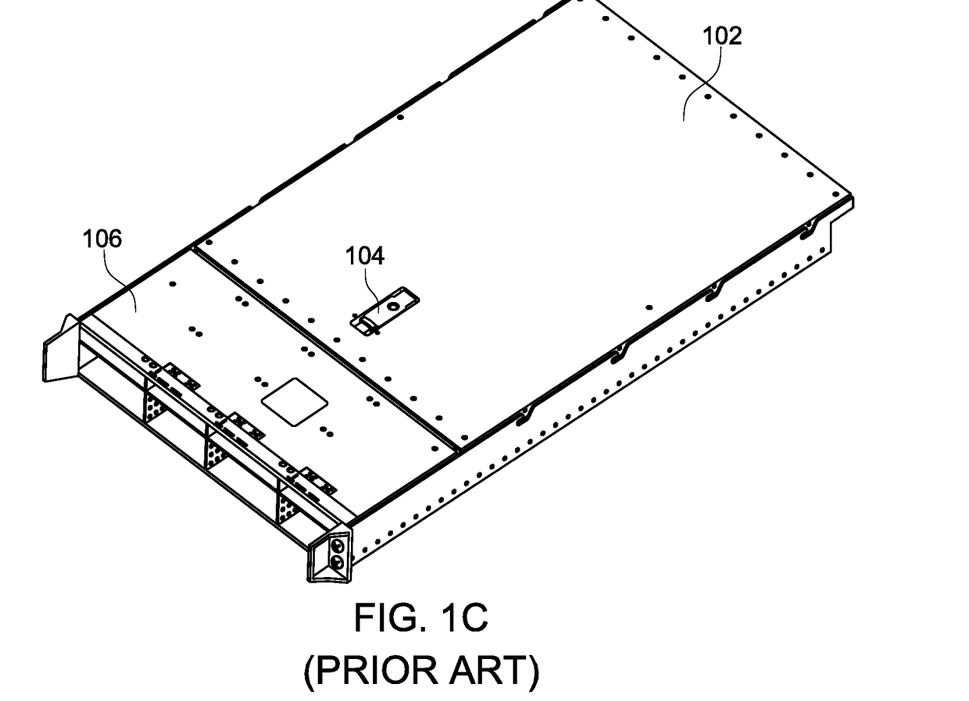

FIGS. 1A-1D show an exemplary computer chassis and top cover, as known in the prior art. A conventional design includes a top cover 102, a latch module 104, and a chassis base component 106. FIG. 1A shows how the top cover 102 must manually be placed into the chassis base component 106 while the latch module 104 is held open. Once the top cover 102 is placed on the chassis base component 106 (FIG. 1B), the latch module 104 can be released (FIG. 1C) to secure the top cover 102 in place. The connection between the top cover 102 and the chassis base component 106 can be referred to as a mating position.

Figure 1D:
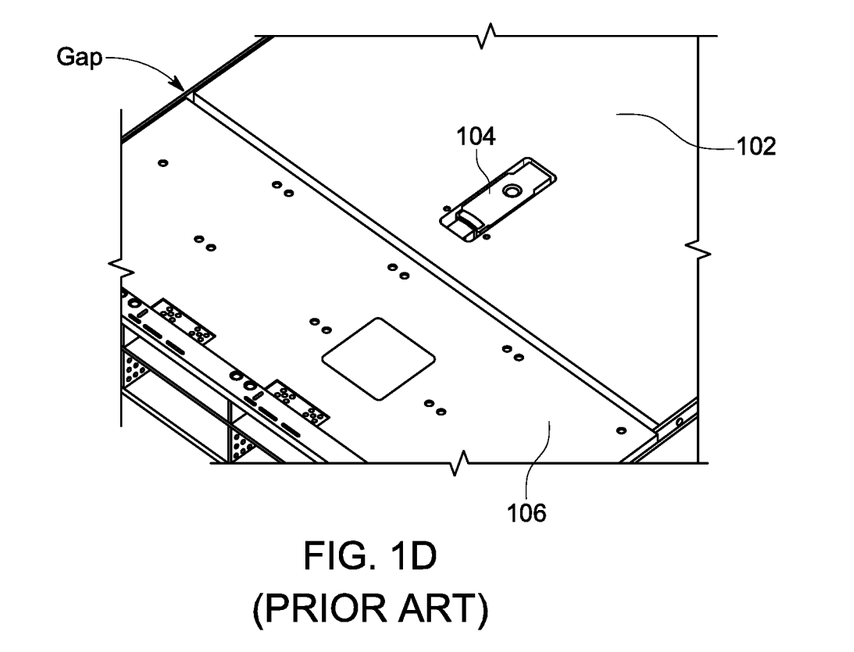

FIG. 1D shows a gap between the top cover 102 and the chassis base component 106 that results from this conventional design. The gap is undesirable in a computer chassis design because it can allow airflow, dust, and debris to enter the computer chassis. Airflow can cause heating and cooling problems for any components of the chassis, and the dust and debris can damage computer components. Additionally, the gap can be visually unappealing.

Figure 2:
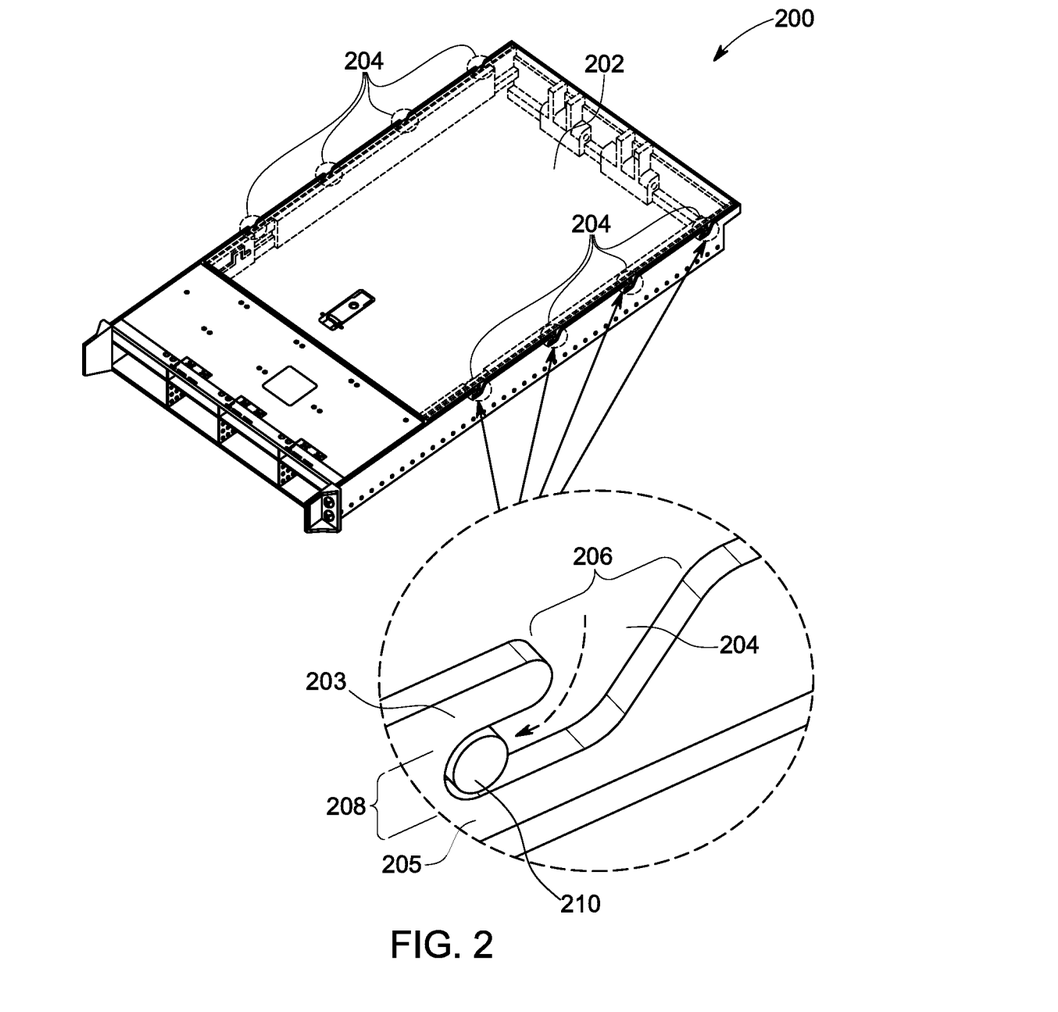
FIG. 2 shows an exemplary computer chassis layout according to an embodiment of the present disclosure.

Therefore, the present disclosure provides a device which reduces the gap through use of an elastomer. FIG. 2 shows an exemplary computer chassis 200 according to an embodiment of the present disclosure. For the purposes of the present disclosure, an exemplary computer chassis can include the chassis base component 202 and guide slots 204. The guide slots can have an upper wall 203, a lower wall 205, an opening portion 206, and an end portion 208. The guide slots 204 can be located along the exterior of opposing sides of the chassis base component 202, in order to provide a plurality of locations for a top cover (not shown) to be linked to the chassis base component 202. Although eight guide slots 204 are shown in FIG. 2, there can be any number of guide slots 204. The guide slot 204 can have an upper wall 203 and a lower wall 205 through which a guide pin 210 can slide. The guide slot 204 can have an opening portion 206, where a guide pin 210 enters, and an end portion 208, which receives the guide pin 210. The end portion 208 can have a width that can be approximately the same as a diameter of a guide pin 210. The guide slot 204 can be tapered between the opening portion 206 and the end portion 208 such that the guide slot 204 eventually reaches a smaller diameter than the diameter of a guide pin 210. This point can be referred to as a hard stop because the guide pin 210 can go no further into the guide slot 204. An exemplary guide pin can be cylindrically shaped, as shown in FIG. 2. In some examples, an exemplary guide pin can have other features, such as a groove, ridge, or hook, however no other features are needed for the guide pin to fit within the guide slot 204.

Figure 3:
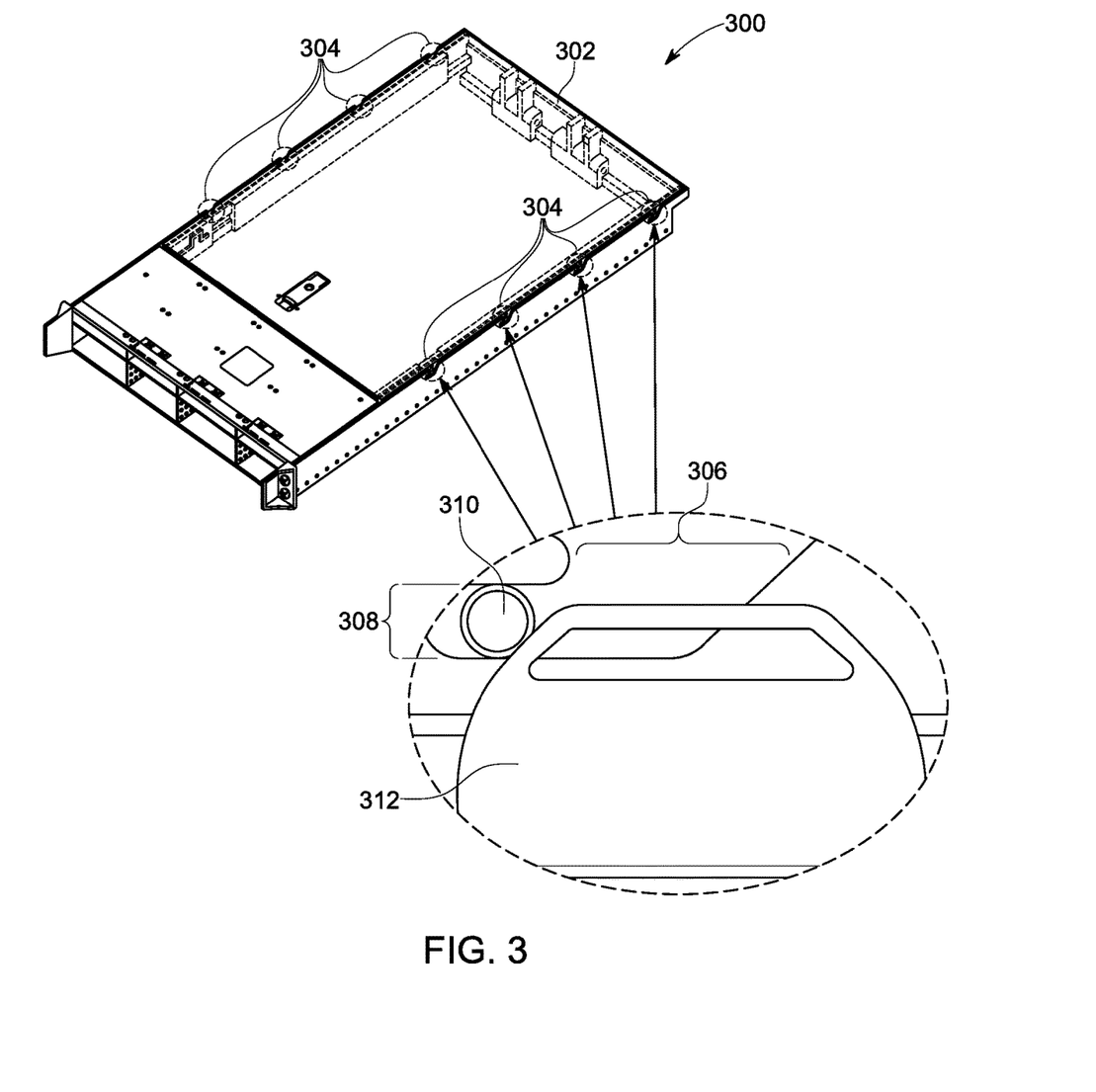
FIG. 3 shows an exemplary elastomer placement according to an embodiment of the present disclosure.

FIG. 3 shows an exemplary elastomer placement in a computer chassis according to an embodiment of the present disclosure. FIG. 3 includes many of the same components as FIG. 2, including a chassis base component 302, guide slots 304, a guide slot opening portion 306, a guide slot end portion 308. In addition, FIG. 3 includes a guide pin 310 and an elastomer 312. The guide pin 310 can be attached to a top cover (not shown), and can be pushed into the guide slot 304 when the top cover is put into a mating position with the chassis 300. The elastomer 312 can be placed adjacent to a guide slot 304. The elastomers 312 can be placed adjacent all guide slots 304, or placed adjacent to only selected guide slots 304. The elastomer 312 can be depressed due to the entry of the guide pin 310 so that the guide pin can be stably received in the end portion 308 of the guide slot 304. This is shown further in FIGS. 5A-5C.

Therefore, according to the structures shown in FIG. 3, there can be an elastomer force acting on the top cover. The elastomer force can be varied according to the number of elastomers in the chassis base component. For example, if the chassis base component has eight guide slots and each guide slot has an elastomer, then the total elastic force exerted on the top cover will be the sum of the elastic force exerted by all eight elastomers 312. While the top cover is sliding into the guide slot 304, there can additionally be a frictional force acting on the top cover which resists the entrance of the top cover into a mating position with the chassis 300. However, the eight elastomers can have a total elastic force which is greater than the frictional force. Thereby, the elastomers can encourage and sustain a mating position between the top cover and chassis 300.

Figure 4A:
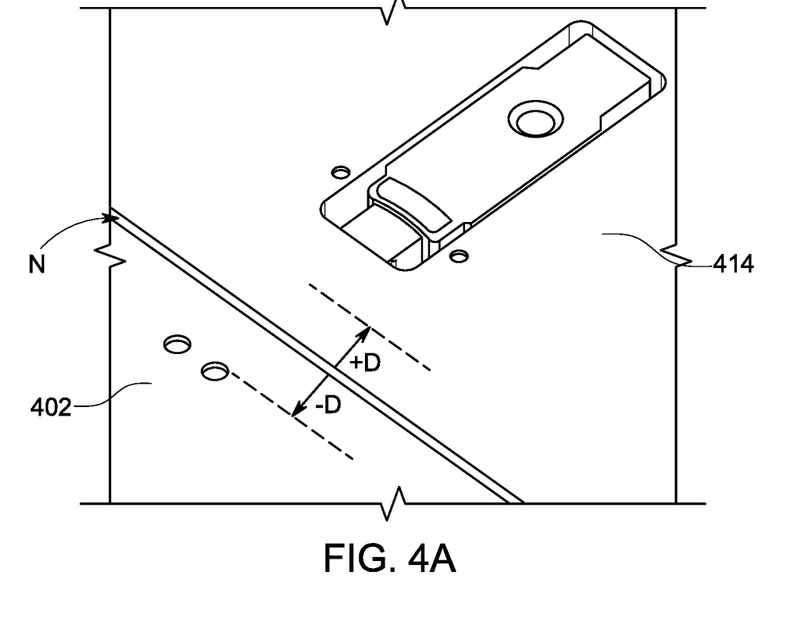
FIG. 4A shows exemplary dimensions of a target gap of a computer chassis and top cover, according to an embodiment of the present disclosure.

FIG. 4A shows exemplary dimensions of a gap between a top cover 414 and a chassis base component 402, according to an embodiment of the present disclosure. For example, the gap can be a nominal distance N with a standard deviation in the length of the gap D.

Figure 4B:
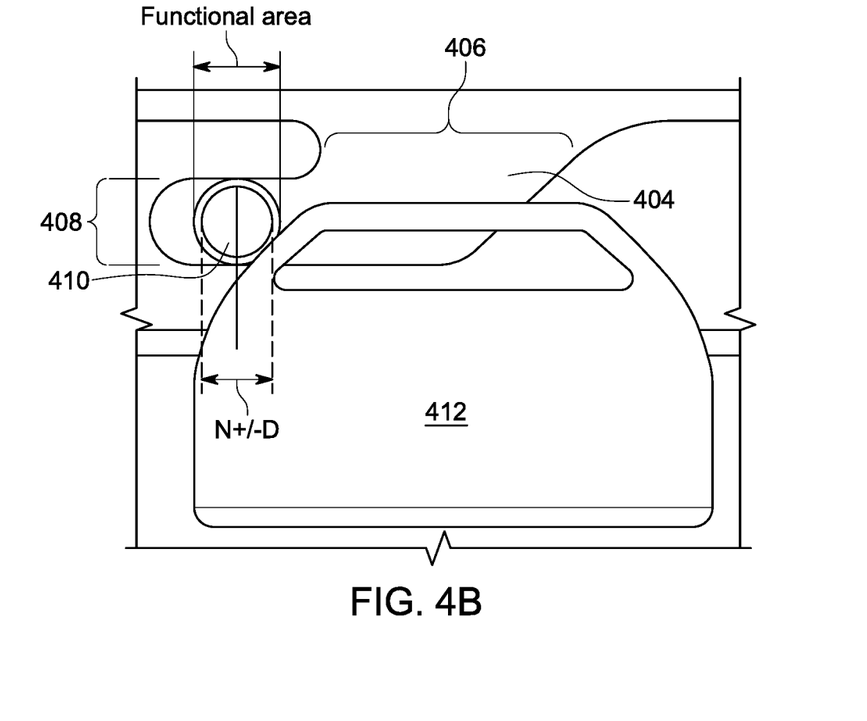
FIG. 4B shows an exemplary elastomer placement with relation to a guide pin and guide slot, according to an embodiment of the present disclosure.

FIG. 4B shows how an exemplary elastomer can be designed according to the dimensions of a target gap shown in FIG. 4A. FIG. 4B shows a guide slot 404, a guide slot opening portion 406, a guide slot end portion 408, a guide pin 410, and an elastomer 412. These components are similar to those discussed earlier with respect to FIGS. 2 and 3. Notably, FIG. 4B shows how the elastomer 412 can be positioned to secure the guide pin 410 in a functional area. The functional area can be larger than the length of the nominal distance N added to the length of the standard deviation D. In some cases, the functional area can also be N minus D. The elastomer 412 can be configured to exert a force on the guide pin 410 whenever the guide pin 410 is in the functional area. The elastomer 412 can be positioned based on a desired nominal distance N and standard deviation D.

Therefore, at a resting location of the guide pin 410 in the guide slot 404, the gap of FIG. 4A can be minimized or eliminated. Additionally, the elastomer 412 can be located to guarantee a target gap size. When more pressure is exerted on the guide pin 410 by the elastomer 412, the top cover pushes forwards against the chassis base component. This movement reduces a size of the gap.

Figure 5A:
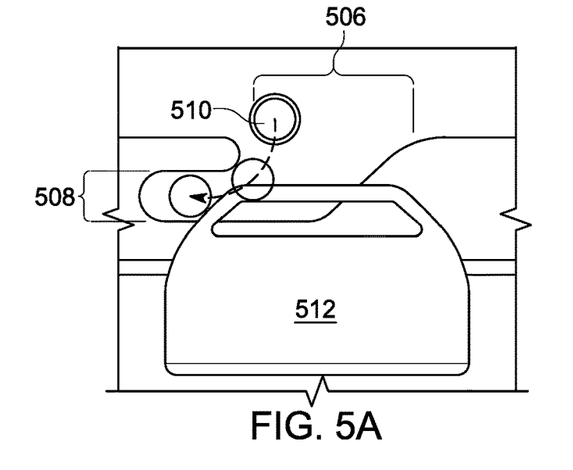
FIGS. 5A-5C show an exemplary guide pin engaging with a guide slot and an elastomer, according to an embodiment of the present disclosure.
Figure 5B:
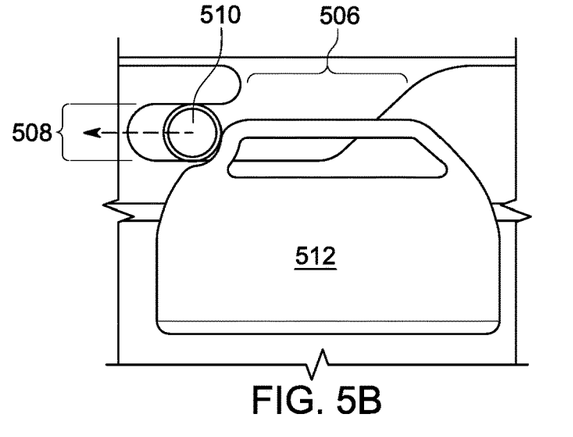
Figure 5C:
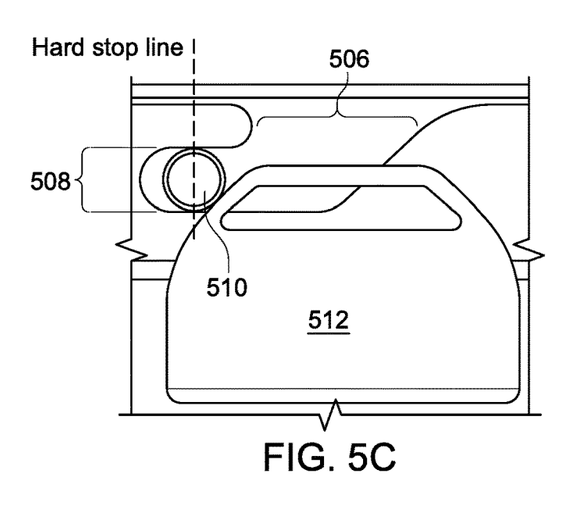

FIGS. 5A-5C show an exemplary guide pin engaging with a guide slot and an elastomer, according to an embodiment of the present disclosure. FIGS. 5A-5C include a guide slot opening portion 506, a guide slot end portion 508, a guide pin 510, and an elastomer 512. FIGS. 5A-5C show that as the guide pin is pushed into the guide slot, it slides over the top of the elastomer 512 and then comes to a rest within the guide slot end portion 508. FIG. 5B shows that there can be a slight deformation in the elastomer 512 as the guide pin 510 comes into contact with the elastomer 512. FIG. 5C shows that in some configurations of the present disclosure, a hard stop line can be provided where the guide pin 510 can slide no further along the tapered portion, or the downward sloping portion, of the guide slot end portion 508. This hard stop line can be where a diameter of the guide pin is substantially the same as a width of the guide slot end portion 508. This hard stop line controls a mating position of a top cover relative to the chassis.

The position of the elastomer as shown in FIGS. 5A-5C can define an interference fit between the chassis base component and the top cover so that the top cover overlaps with the chassis base component. However, any stress incurred due to the physical configuration of the chassis base component and the top cover can be absorbed by the elastomer such that the chassis base component and the top cover will not be damaged by the interference. Therefore, the present disclosure provides advantages over conventional designs which do not provide means to absorb stress incurred by a fit between the chassis base component and the top cover.

Figure 6A:
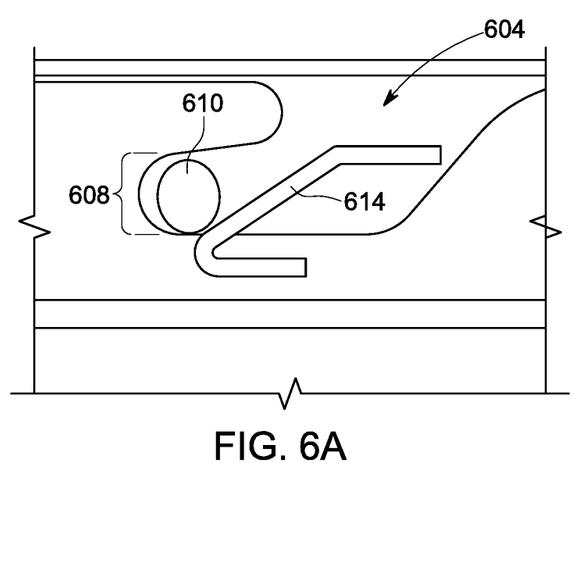
FIG. 6A shows an exemplary simplified elastomer design, according to an embodiment of the present disclosure.

FIG. 6A shows an exemplary simplified elastomer design, according to an embodiment of the present disclosure. The elastomer design can include a guide slot 604, a guide slot end portion 608, guide pin 610, and a biasing element 614. The biasing element can function to push against a guide pin 610 and can position the guide pin 610 to retain its configuration at the end portion 608 of the guide slot 604.

Figure 6B:
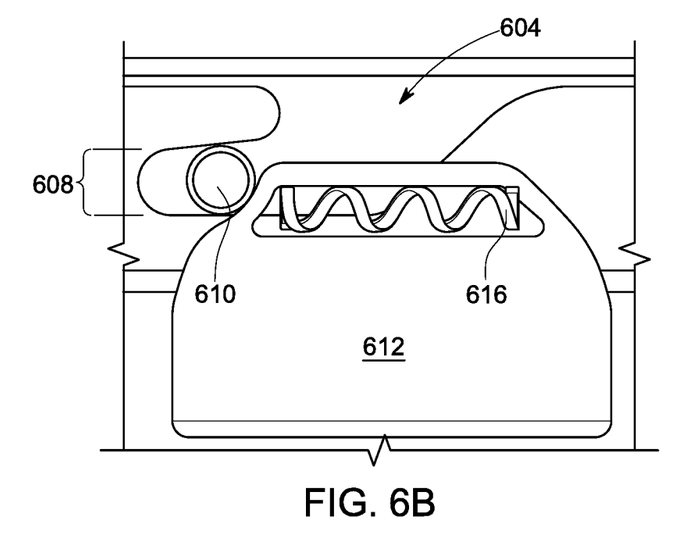
FIG. 6B shows an exemplary elastomer with a spring, according to an embodiment of the present disclosure.

FIG. 6B shows an exemplary elastomer with a spring, according to an embodiment of the present disclosure. This embodiment of the present disclosure can include a guide pin 610, an elastomer 612, and a spring 616. Although FIG. 6B shows the spring 616 inside the elastomer 612, the spring 616 can be in any configuration so long as it exerts pressure on the guide pin 610. The spring 616 can server to increase an elastic force of the elastomer 612 as the elastomer 612 pushes the top cover into the chassis base component. Additionally, the spring 616 can provide additional support to the elastomer 612 in case the top cover is too heavy to be guided into the guide slot by just the elastomer 612.

While various examples of the present invention have been described above, it should be understood that they have been presented by way of example only, and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A chassis for a computing device comprising:
a base component defining a plurality of guide slots therein;
a top cover comprising a plurality of guide pins corresponding to the plurality of guide slots so that the plurality of guide pins are positioned in the plurality of guide slots when the base component and the top cover are in a mating position; and
an elastomer biasing element, positioned adjacent to at least one of the guide slots such that the elastomer biasing element deforms at a point of contact with at least one of the guide pins and pushes against the at least one of the guide pins, the at least one of the guide pins corresponding to the at least one of the guide slots in the mating position,
wherein the at least one of the guide slots is tapered between an opening portion and an end portion, such that the corresponding at least one of the guide pins encounters a hard stop before reaching the end portion of the at least one of the guide slots, thereby controlling the mating position.

2. The chassis of claim 1, wherein the hard stop positions the top cover so as to define a gap between the base component and the top cover.

3. The chassis of claim 1, wherein the biasing element positions the top cover so as to define an interference fit with the base component.

4. The chassis of claim 1, further comprising a spring to assist the biasing element m pushing against the at least one of the plurality of guide pins.

5. The chassis of claim 4, wherein the spring is incorporated into the biasing element.

6. The chassis of claim 1, wherein the biasing element possesses an elastic force greater than the frictional force of the top cover with the base component.

7. The chassis of claim 1, wherein an upper and lower wall of the guide slots define a functional area in which the guide pins are positioned to assure a target largest and smallest gap between the top cover and base component.

8. The chassis of claim 7, wherein the biasing element is positioned so as to maintain the at least one of the guide pins in the functional area.

9. The chassis of claim 7, wherein the functional area is larger than a distance of the target gap.

10. The chassis of claim 7, wherein the target gap comprises a nominal distance N +/− a deviation D.

11. The chassis of claim 1, wherein the guide slots are provided on opposing sides of the chassis.

12. The chassis of claim 11, further comprising a plurality of biasing elements adjacent each of the plurality of guide slots.

13. The chassis of claim 1, wherein the corresponding guide pins have a circular cross-section.

14. The chassis of claim 1, wherein the guide pins are cylindrically shaped.

* * * * *